(12) United States Patent
Kobayashi et al.

(10) Patent No.: US 6,803,766 B2
(45) Date of Patent: Oct. 12, 2004

(54) BATTERY PACK VOLTAGE DETECTION APPARATUS

(75) Inventors: Tetsuya Kobayashi, Anjo (JP); Hiroshi Fujita, Kuwana (JP)

(73) Assignee: Denso Corporation, Kariya (JP)

( * ) Notice: Subject to any disclaimer, the term of this patent is extended or adjusted under 35 U.S.C. 154(b) by 101 days.

(21) Appl. No.: 10/245,364

(22) Filed: Sep. 18, 2002

(65) Prior Publication Data

US 2004/0051534 A1 Mar. 18, 2004

(51) Int. Cl.[7] .............................................. G01N 27/416
(52) U.S. Cl. ..................................... 324/434; 320/116
(58) Field of Search ................................ 324/434, 426, 324/429; 320/116, 118, 119, 121, 140

(56) References Cited

U.S. PATENT DOCUMENTS 6,020,717 A   2/2000  Kadouchi et al. ........... 320/116
6,157,165 A * 12/2000  Kinoshita et al. ........... 320/116
6,362,627 B1 * 3/2002  Shimamoto et al. ........ 324/434

FOREIGN PATENT DOCUMENTS

JP            A 9-1617         1/1997

* cited by examiner

*Primary Examiner*—Lawrence Luk
(74) *Attorney, Agent, or Firm*—Oliff & Berridge, PLC

(57) ABSTRACT

A battery cell voltages are read in parallel to a capacitor for each battery block of a battery pack by the use of analog switches. The stored voltages of the capacitors are A/D-converted sequentially through the analog switches. Thereby, each cell voltage is measured with suppression of measurement error by the use of the simple flying capacitor type circuit structure, while the circuit safety is secured by providing the current limitation resistor having a large resistance value between each cell and the analog switch. A noise reduction circuit having a pair of capacitors is provided.

33 Claims, 12 Drawing Sheets

BATTERY PACK VOLTAGE DETECTION APPARATUS

CROSS REFERENCE TO RELATED APPLICATION

This application is based on and incorporates herein by reference Japanese Patent Applications No. 2000-353179, No. 2001-90786, No. 2001-90795 and No. 2001-276896 filed on Nov. 20, 2000, Mar. 27, 2001, Mar. 27, 2001 and Sep. 12, 2001, respectively.

FIELD OF THE INVENTION

The invention relates to a flying capacitor type battery voltage detection apparatus.

BACKGROUND OF THE INVENTION

A battery pack for supplying a high voltage as high as several hundred volts is comprised of many cells (secondary cells or fuel cells) connected in series. This pack is used usually for, for example, a hybrid vehicle, electric vehicle, or fuel battery block electric vehicle in order to reduce the wiring resistance loss and to reduce the size of switching elements.

A high voltage battery pack is provided with a voltage detection apparatus that detects the voltage of each cell for capacity calculation and protection of each cell. A battery block comprising a desired number of cells connected in series is regarded as a cell. Thus the term "cell" in this description means a cell comprising a plurality of battery blocks connected in series with each other.

U.S. Pat. No. 6,362,627 (JP-A-11-248755) proposes a battery pack voltage detection apparatus that uses a flying capacitor and multiplexer circuit. This apparatus is referred to as a flying capacitor type battery voltage detection apparatus as an exemplary battery pack voltage detection apparatus.

The flying capacitor type battery voltage detection apparatus detects the voltage difference of the flying capacitor, namely stored voltage, by means of a voltage detection circuit through a process in which the voltage of each cell is applied to a flying capacitor successively through a pair of analog switches of a multiplexer. The cell voltage is sample-held under shutdown condition of both analog switches. Both ends of the flying capacitor is connected conductively to the voltage detection circuit through respective capacitor potential output analog switches.

However, it is preferable for the flying capacitor type battery voltage detection apparatus to be provided with a current limitation resistor having a large resistance value connected in series to each analog switch to prevent the heavy current flow from the battery pack due to short-circuit failure and insulation failure (ground fault failure) of the analog switch of the multiplexer.

However, if a current limitation resistor is provided, it takes a long time that the terminal voltage of a capacitor, namely flying capacitor, reaches the cell voltage. The time required to measure all the cell voltage increases. The increased cell voltage measurement time causes fluctuation of the operation condition in the duration of measurement, particularly fluctuation of current, voltage, temperature, and SOC. This resultantly causes a serious error of the battery pack performance calculated based on the measured cell voltage and current.

This problem can be solved by providing a plurality of capacitors, by increasing the number of analog switches, and by reducing the number of input of each analog switch. However, the circuit structure becomes complicated.

SUMMARY OF THE INVENTION

It is therefore an object of the present invention to provide a flying capacitor type battery pack voltage detection apparatus, which has less measurement error and less complication.

According to the present invention, battery cell voltages of a battery pack are read in parallel to capacitors by the use of analog switches. The stored voltages of the capacitors are A/D-converted sequentially through the analog switches. Thereby, each cell voltage is measured with suppression of measurement error by the use of the simple flying capacitor type circuit structure while the circuit safety is secured by providing the current limitation resistor between each cell and the analog switch. A common noise reduction circuit having a pair of capacitors is provided.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

[First Embodiment]

Figure 1:
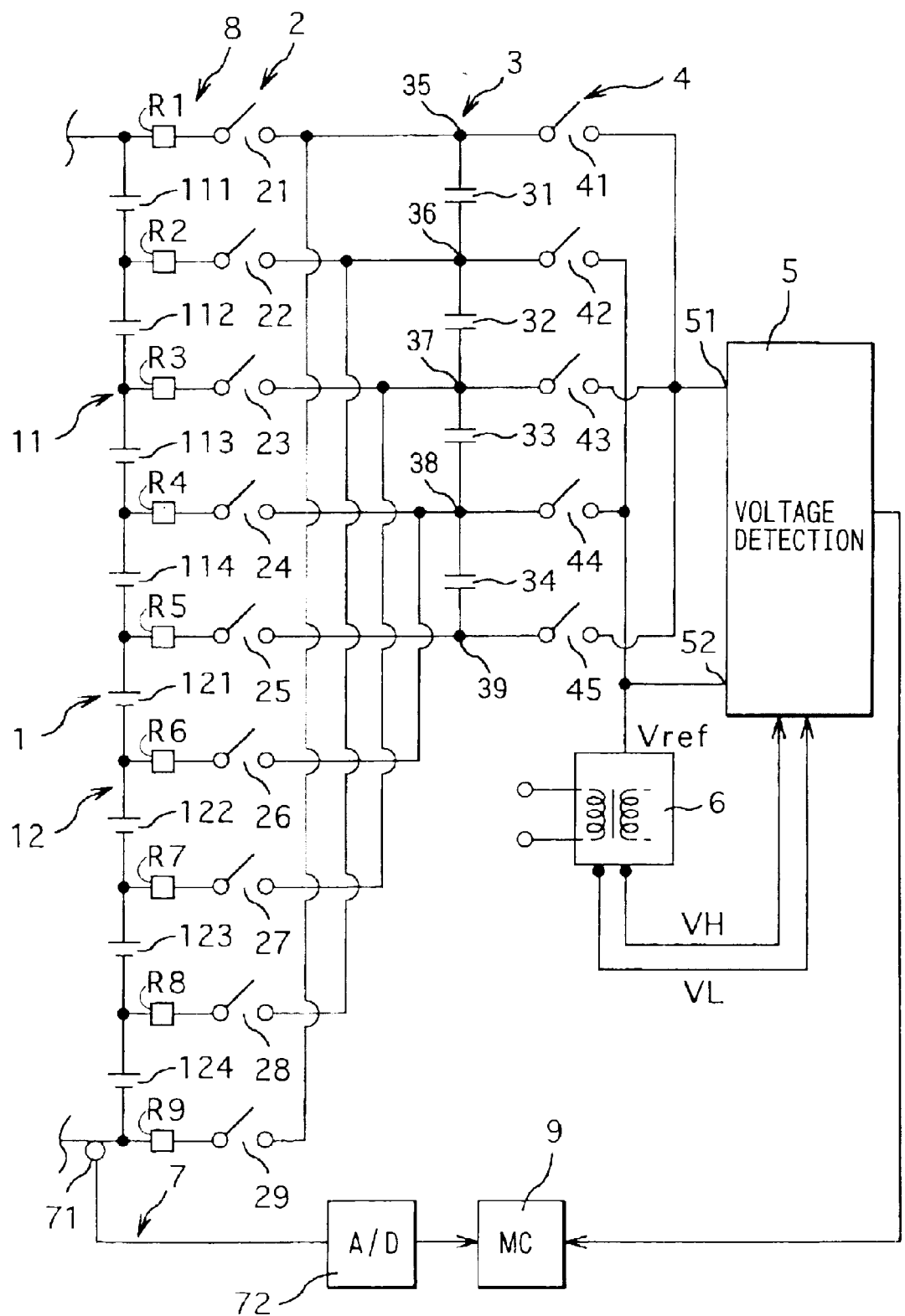
FIG. 1 is a circuit diagram showing a battery pack voltage detection circuit in accordance with a first embodiment of the present invention.

Referring first to FIG. 1, numeral 1 denotes a battery pack, 2 denotes a multiplexer (input analog switch group), 3 denotes a capacitor group, 4 denotes a multiplexer (output analog switch group), 5 denotes a voltage detection circuit, 6 denotes a power source circuit, 7 denotes a current detection circuit, 8 denotes a current limitation resistor group. The current limitation resistor group 8 comprises current limitation resistors R1 to R8. The battery pack 1 comprises battery blocks 11 and 12 that are connected in series. The battery block 11 comprises four cells 111 to 114 that are connected in series. The battery block 12 comprises four cells 121 to 124 that are connected in series. The input analog switch group 2 comprises analog switches 21 to 29. The capacitor group 3 comprises capacitors 31 to 34 that are connected in series. The output analog switch group 4 comprises analog switches 41 to 45.

Each terminal (positive electrode end or negative electrode end) of the cells 111 to 114 of the battery block 11 is connected to the one end of the respective analog switches 21 to 25 individually through the respective current limitation resistors R1 to R5 individually. Each terminal (positive electrode end or negative electrode end) of the cells 121 to 124 of the battery block 12 is connected to the one end of the respective analog switches 21 to 25 individually through the respective current limitation resistors R5 to R9 individually.

The low potential side terminal (negative electrode end) of the cell 124 is connected to the terminal 35 of the capacitor 31 through the current limitation resistor R9 and analog switch 29. The low potential side terminal (negative electrode end) of the cell 123 is connected to the terminal 36 of the capacitor 32 through the current limitation resistor R8 and analog switch 28. The low potential side terminal (negative electrode end) of the cell 122 is connected to the terminal 37 of the capacitor 33 through the current limitation resistor R7 and analog switch 27. The low potential side terminal (negative electrode end) of the cell 121 is connected to the terminal 38 of the capacitor 34 through the current limitation resistor R6 and analog switch 26.

The other ends of the analog switches 21 to 25 are connected to the terminals 35 to 39 of the respective capacitors 31 to 34 individually.

The other end of the analog switch 29 is connected to the high potential side terminal of the capacitor 31. The other end of the analog switch 28 is connected to the high potential side terminal of the capacitor 32. The other end of the analog switch 27 is connected to the high potential side terminal of the capacitor 33. The other end of the analog switch 26 is connected to the high potential side terminal of the capacitor 34. Because the high potential side analog switches 21 to 24 are connected to the low potential side analog switches 26 to 29 in the relation of reflection in the mirror with respect to the analog switch 25, this connection is referred to as "mirror connection".

The respective terminals 35, 37 and 39 of the capacitors 31 to 34 are connected to the input terminal 51 of the voltage detection circuit 5 through respective analog switches 41, 43, and 45, which are components of a multiplexer, individually. The respective terminals 36 and 38 of the capacitors 31 to 34 are connected to the input terminal 52 of the voltage detection circuit 5 through respective analog switches 42 and 44, which are components of the multiplexer, individually.

The voltage detection circuit 5 comprises a pair of voltage amplifiers for amplifying the terminal potential of the capacitors supplied to the input terminals 51 and 52 based on a predetermined reference voltage, and a pair of A/D-converters for A/D-converting the output signal voltage of these amplifiers individually. The circuit structure and operation of the voltage detection circuit 5 is well known, and the description is omitted.

Otherwise, the terminal voltage of the capacitor supplied to the input terminals 51 and 52 may be amplified differentially by the use of one voltage amplifier of the voltage detection circuit 5 to A/D-convert the output signal voltage.

The power source circuit 6 applies a reference voltage Vref to the input terminal 52 of the voltage detection circuit 5, and applies low and high power source voltages VH and VL on the voltage detection circuit 5. The power source voltage VH is set to a value larger than the reference voltage Vref by a predetermined value (for example, 5 V). The power source voltage VL is set to a value smaller than the reference voltage Vref by the predetermined value (for example, 5 V).

The current detection circuit 7 is provided with a current sensor 71 for detecting a current of the battery pack 1 and an A/D-converter 72 for A/D-converting the analog current value detected by the current sensor 71. The A/D-converter 72 supplies a digital current signal to a microcomputer (MC) 9. Similarly, the voltage detection circuit 5 supplies a detected digital voltage signal to the microcomputer 9.

The microcomputer 9 computes SOC of the battery pack 1 based on the input signal. The microcomputer 9 also control each analog switch and the sampling timing of each A/D-converter.

Next, the operation of this embodiment will be described. All the analog switches are turned off initially.

(Cell Voltage Measurement of Battery Block 11)

At first, the analog switches 21 to 25 are turned on to thereby apply terminal voltages of the cells 111 to 114 respectively on the capacitors 31 to 34. After a predetermined duration, the analog switches 21 to 25 are turned off.

Next, the analog switches 41 and 42 are turned on to supply voltages of both ends of the capacitor 31 to the input terminals 51 and 52 of the voltage detection circuit 5. The pair of A/D-converters of the voltage detection circuit 5 A/D-convert the voltages to digital voltage signals, and the digital voltage signals are held temporarily in a built-in digital memory. As a matter of course, the digital voltage signals may be transmitted directly to the microcomputer 9.

Next, the analog switch 41 is turned off and the analog switch 43 is turned on to supply voltages of both ends of the capacitor 32 to the input terminals 51 and 52 of the voltage detection circuit 5. The pair of A/D-converters of the voltage detection circuit 5 A/D-converts the voltages to digital voltage signals, and the digital voltage signals are held temporarily in the built-in digital memory.

Next, the analog switch 42 is turned off and the analog switch 44 is turned on to supply voltages of both ends of the capacitor 33 to the input terminals 51 and 52 of the voltage detection circuit 5. The pair of A/D-converters of the voltage detection circuit 5 A/D-converts the voltages to digital voltage signals, and the digital voltage signals are held temporarily in the built-in digital memory.

Next, the analog switch 43 is turned off and the analog switch 45 is turned on to supply voltages of both ends of the capacitor 34 to the input terminals 51 and 52 of the voltage detection circuit 5. The pair of A/D-converters of the voltage detection circuit 5 A/D-converts the voltages to digital voltage signals, and the digital voltage signals are held temporarily in the built-in digital memory. Then the analog switches 44 and 45 are turned off.

Next, the analog switches 25 to 29 are turned on and respective voltages of the cells 121 to 124 are applied on the capacitors 31 to 34. After a predetermined duration, the analog switches 25 to 29 are turned off.

Next, in the same manner as used for the cell voltage detection of the battery block 11, the analog switches 41 to 45 are turned on sequentially one pair by one pair so that the stored voltages of the capacitors 31 to 34 are A/D-converted by means of the voltage detection circuit 5, and the A/D-converted stored voltages are held temporarily. As a matter of course, the A/D-converted stored voltage may be transmitted to the microcomputer 9 directly.

Next, the eight pairs of digital voltage signals held temporarily in the voltage detection circuit 5 are transmitted to the microcomputer 9, and the microcomputer 9 computes these digital voltage signals to determine each cell voltage.

More specifically, the voltage of the cell 111 is calculated based on the absolute value of the difference between a pair of digital signals determined when the analog switches 41 and 42 are turned on. In the same manner as described above, each cell voltage is calculated based on the absolute value of the difference between a pair of digital signals that has been A/D-converted simultaneously. As a matter of course, if the digital subtraction is carried out by the use of the voltage detection circuit 5 and the result is held temporarily, the temporary hold memory of the voltage detection circuit 5 can be reduced.

In the case that the voltage detection circuit 5 differentially amplifies the difference of a pair of potentials supplied simultaneously to the input terminals 51 and 52 by the use of a differential amplifier, it is preferable that the differentially amplified value is converted into an absolute value by the use of an analog absolute value circuit and then A/D-converted. Conversion to an absolute value may be carried out by the use of a digital circuit as described below. In detail, the difference between a digital signal value obtained by A/D-converting a differentially amplified value and a digital value that is equivalent to the cell voltage of 0 V is obtained, and the absolute value of the difference may be calculated. The digital value that is equivalent to the cell voltage of 0 V is obtained by a way in which, for example, differential amplification is carried out by the use of a differential amplifier of the voltage detection circuit 5 in the state that the analog switches 41 to 44 are turned off or more preferably the input terminals 51 and 52 are short-circuited by the use of a short-circuit switch, and the output voltage may be A/D-converted.

In the first embodiment, the operation for reading cell voltages of the battery block 11 (or 12) in the capacitors 31 to 34 is carried out in parallel, but the cell voltages are read out from the capacitors 31 to 34 time-sequentially. The reason of the difference is described as follows. The reading-in operation takes a long time due to a large time constant for reading-in operation, because high resistance current limitation resistor group 8 is provided between the high voltage battery pack 1 having a small output impedance and the analog switch group 2 during the reading-in operation. On the other hand, during reading-out operation, because the input impedance of the voltage detection circuit 5 is large and A/D conversion can be carried out at high speed currently, the time required for A/D conversion of the stored voltage of one capacitor is very short. As a result, high speed cell voltage measurement is realized without complex circuit structure.

Next, the current measurement will be described as follows.

In this embodiment, the microcomputer 9 commands the A/D-converter 72 to sample-hold the current signal after a predetermined time (coincident with the difference between the cut-off delay time of the analog switches 21 to 25 and the cut-off delay time of the A/D-converter 72) from the time when the microcomputer 9 commands the analog switches 21 to 25 to be turned off. The reason is that the cut-off delay time of the analog switches 21 to 24 comprising photo MOS transistors is far larger than the cut-off delay time of the analog switch for sample-holding of the A/D-converter usually. As a result, the voltage sampling and the current sampling are carried out simultaneously, and the electric state of the battery block 11 can be calculated accurately by the use of both data.

Similarly in this embodiment, the microcomputer 9 commands the A/D-converter 72 to sample-hold the current signal after a predetermined time (coincident with the difference between the cut-off delay time of the analog switches 21 to 25 and the cut-off delay time of the A/D-converter) from the time when the microcomputer 9 commands the analog switches 25 to 29 to be turned off. The reason is that the cut-off delay time of the analog switches 25 to 29 comprising photo MOS transistors is much larger than the cut-off delay time of the analog switch for sample-holding of the A/D-converter usually. As a result, the voltage sampling and the current sampling are carried out simultaneously, and the electric state of the battery block 11 can be calculated accurately by the use of both data.

Furthermore in this embodiment, the microcomputer 9 uses the voltage/current data sampled simultaneously for the electric state detection (typically for SOC calculation) of the cells 111 to 114 of the battery block 11, and uses the voltage and current data sampled simultaneously for the electric state detection (typically for SOC calculation) of the cells 121 to 124 of the battery block 12. That is, the SOC calculation of the different battery blocks having the cells of voltages measured sequentially is carried out by the use of the current value sampled at different timing in this embodiment. Thereby, the SOC of each cell can be measured accurately, because the measurement time difference between the voltage and current is eliminated though the voltage is sampled sequentially.

Figure 2:
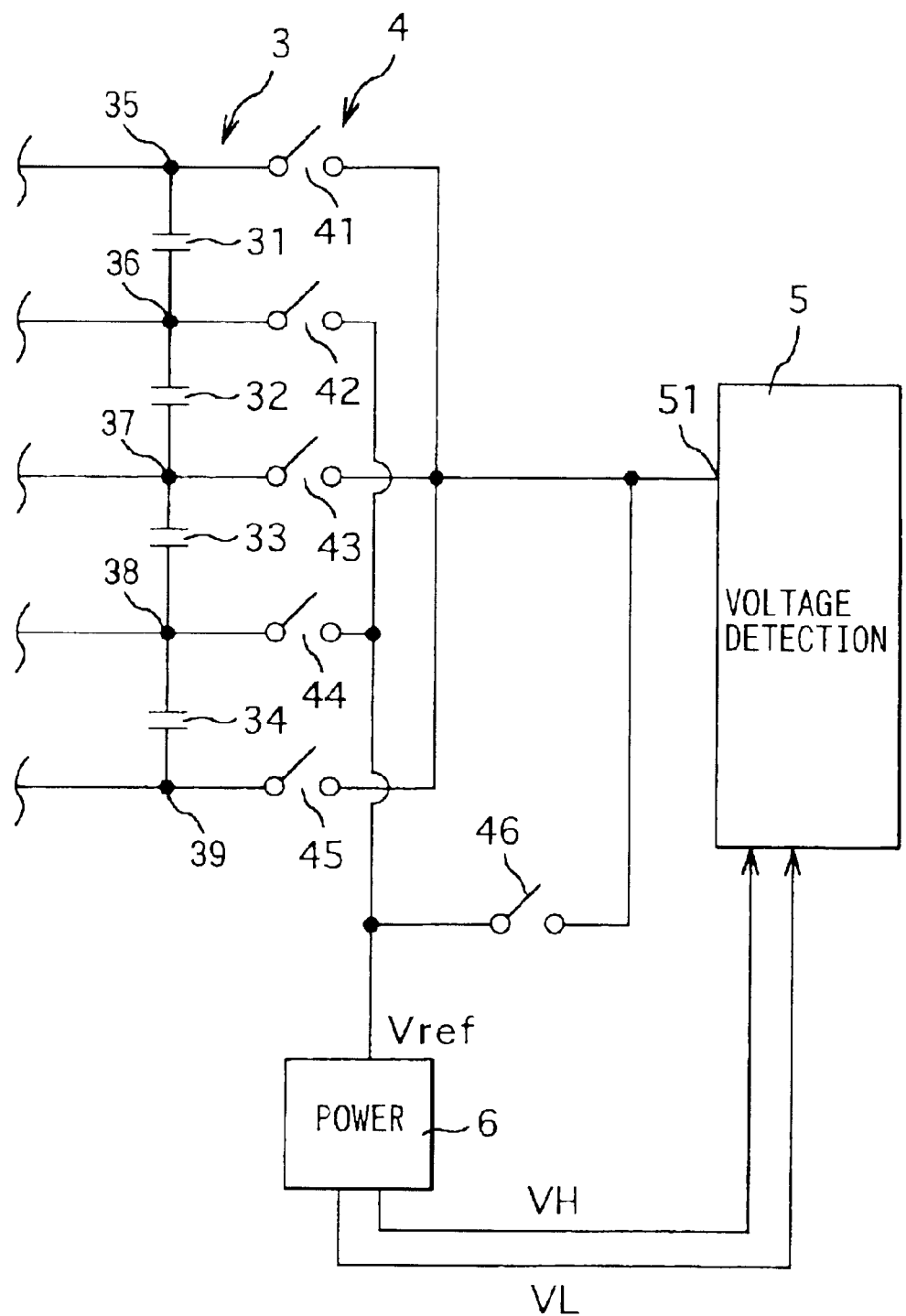
FIG. 2 is a circuit diagram showing a battery pack voltage detection circuit in accordance with a first modified embodiment of the first embodiment of the present invention.

The first modification of the first embodiment is shown in FIG. 2. In this modification, the voltage detection circuit 5 is provided with only one input terminal 51. The potentials of respective terminals 35, 37, and 39 of capacitors 31 to 34 are supplied to an A/D-converter through an amplifier or directly, and the amplifier or A/D-converter of the voltage detection circuit 5 amplifies or A/D-converts the potentials of the respective terminals 35, 37, and 39 of the capacitors 31 to 34 sequentially based on a predetermined reference voltage.

This modification is characterized in that the reference potential is supplied sequentially together with the potentials of the respective terminals 35, 37, and 39 of the capacitors 31 to 34 to the input terminal 51 of the voltage detection circuit 5 through the analog switch 46. The circuit structure and operation other than those are similar to those described in the first embodiment.

According to this modification, the same effect can be brought about by obtaining the absolute value of the difference between the digital potentials of the terminals 35, 37, and 39 and the digital potential of the reference potential with the simple circuit structure compared with that of the first embodiment.

Figure 3:
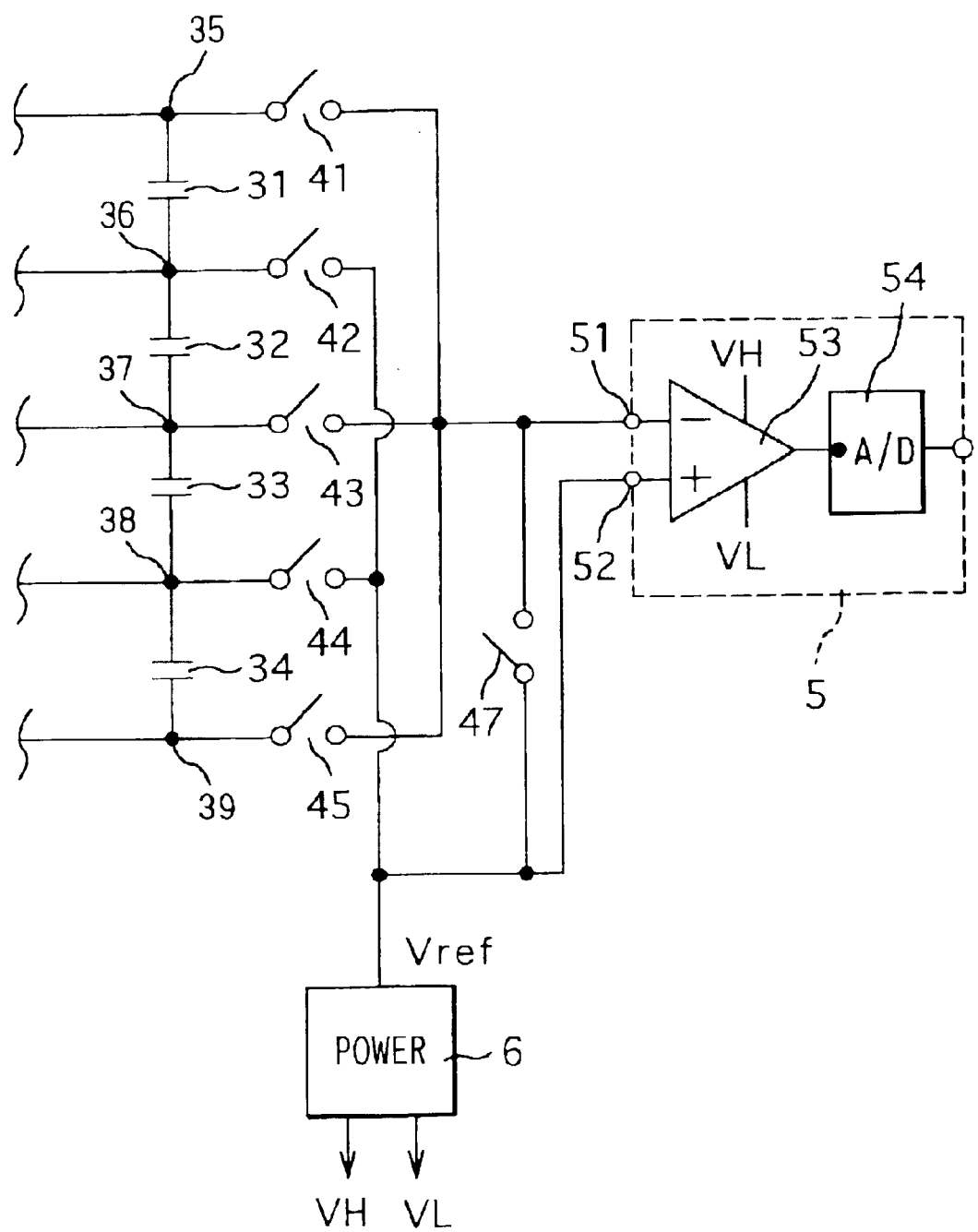
FIG. 3 is a circuit diagram showing a battery pack voltage detection circuit in accordance with a second modified embodiment of the first embodiment of the present invention.

The second modification of the first embodiment is shown in FIG. 3. In this modification, the voltage detection circuit 5 is provided with two input terminals 51 and 52 as in the first embodiment. However, potentials of the input terminals 51 and 52, namely terminal voltages of each capacitor, are differentially amplified by means of one differential amplifier 53 and then A/D-converted by means of an A/D-converter 54 sequentially.

The digital signal generated from the A/D-converter 54 is stored temporarily until all the cell voltages have been A/D-converted, and then transmitted to the microcomputer 9. The digital signal may be transmitted to the microcomputer 9 during reading-in operation of the cell voltage to capacitors 31 to 34 in parallel.

The second modification is characterized in that a short-circuit switch 47 is provided to short-circuit between the input terminals 51 and 52. The short-circuit switch 47 is turned on at a predetermined timing and a digital signal that is corresponding to the cell voltage of 0 V is generated from the A/D-converter 54. As a result, each cell voltage can be measured based on the absolute value of the difference between the digital signal corresponding to 0 V and other digital signals.

In the first embodiment and its modifications, each cell has one battery block, but as a matter of course a battery block comprising a plurality of battery blocks connected in series may be regarded as a cell. A usual MOS may be used for the output analog switch group instead of photo MOS transistor.

[Second Embodiment]

Figure 4:
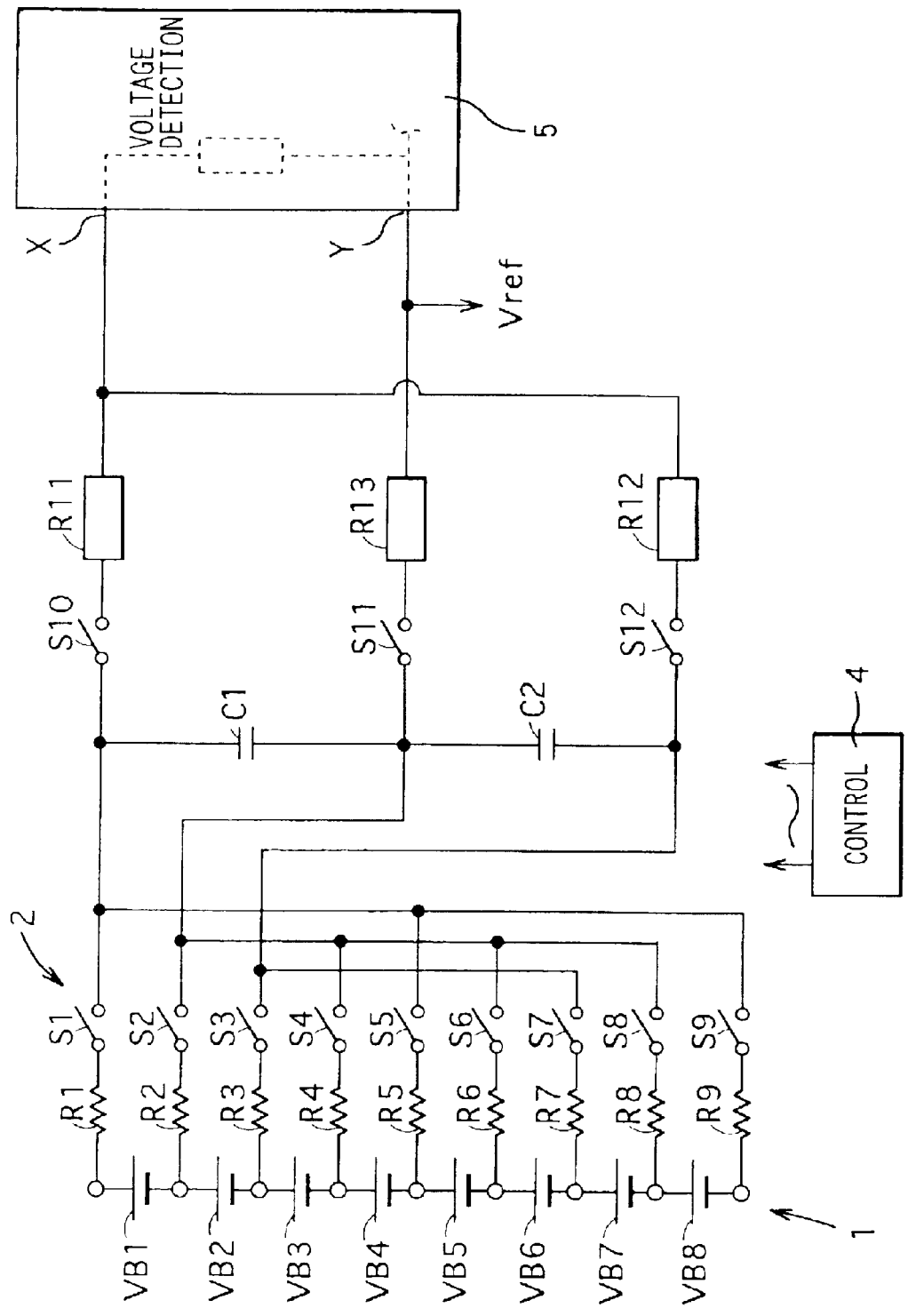
FIG. 4 is a circuit diagram showing a flying capacitor type battery pack voltage detection apparatus in accordance with a second embodiment.

A second embodiment of a battery pack voltage detection apparatus is shown in FIG. 4. A battery pack 1 comprises eight battery blocks VB1 to VB8 that are connected in series. Each battery block (module) comprises the same number of cells that are connected in series, respectively. Each block may comprises a single battery cell. R1 to R9 denote current limitation resistors, S1 to S9 denote analog switches that are connected in series to the respective current limitation resistors R1 to R9 individually and constitute a multiplexer 2. Those switches S1 to S9 are for sampling voltages of the blocks VB1 to VB8.

The analog switches S1, S5, and S9, which are (4m (m is 0 or positive integer)+1)-th analog switches, are provided to connect the (4m (m is 0 or positive integer)+1)-th terminals of the battery pack 1 to the independent terminal of a first flying capacitor C1 individually. The flying capacitors C1 and C2 have the same electrostatic capacity.

The analog switches S3 and S7, which are (4m (m is 0 or positive integer)+3)-th analog switches, are provided to connect the (4m (m is 0 or positive integer)+3)-th terminals of the battery pack 1 to the independent terminal of the second flying capacitor C2 individually.

The analog switches S2, S4, S6, and S8, which are (2m (m is 0 or positive integer), namely even number)-th analog switches, are provided to connect the (2m (m is 0 or positive integer), namely even number)-th terminals of the battery pack 1 to the connection terminals of both flying capacitors C1 and C2 individually.

Analog switches S10 to S12 are output side analog switches, S10 is the first output side analog switch in this embodimet, S11 is the third output side analog switch, and S12 is the second output analog switch.

The analog switch S10 is provided to connect the independent terminal of the first flying capacitor C1 to the first input terminal X of the voltage detection circuit 5 through an input resistor R11, the analog switch S12 is provided to connect the independent terminal of the second flying capacitor C2 to the first input terminal X of the voltage detection circuit 5 through an input resistor R12, and the analog switch S11 is provided to connect the connection point between both flying capacitors C1 and C2 to the third input terminal Y of the voltage detection circuit 5 through an input resistor R13.

The first input resistor R11 is provided to connect the output terminal of the first output side analog switch S10 to the first input terminal X of the voltage detection circuit 5, the second input resistor R12 is provided to connect the output terminal of the second output side analog switch S12 to the first input terminal X of the voltage detection circuit 5, and the third input resistor R13 is provided to connect the output terminal of the third output side analog switch S11 to the second input terminal Y of the voltage detection circuit 5. The voltage detection circuit 5 differentially amplifies the potential difference between both input terminals X and Y. Numeral 40 denotes a controller that turns on the analog switches S1 to S12 in the predetermined sequence at constant intervals, and the controller 40 operates sequentially at a constant timing. Vref denotes a reference potential of the voltage detection circuit 5.

In operation of the voltage detection circuit 5, at first, the analog switches S1, S2, and S3 are turned on. A voltage of the battery block VB1 is read into the flying capacitor C1, and a voltage of the battery block VB2 is read into the flying capacitor C2.

Next, analog switches S1, S2, and S3 are turned off. The analog switches S10 and S11 are turned on for a predetermined period and the potential difference of the flying capacitor C1 is read into the voltage detection circuit 5. Next, the analog switch S10 is turned off, and then the analog switches S11 and S12 are turned on for a predetermined period for reading of the potential difference of the flying capacitor C2 in the voltage detection circuit 5.

The analog switch S11 is turned off and the analog switches S10 and S12 are turned on for a predetermined period to thereby cause conversion of the stored electric energy of the flying capacitors C1 and C2 to thermal energy by the use of the input resistors R11 and R12. Otherwise, the output side analog switch S11 may be turned on when the stored electric energy is dissipated.

The analog switches S3, S4, and S5 are turned on. The voltage of the battery block VB3 is read into the flying capacitor C2, and the voltage of the battery block VB4 is read into the flying capacitor C1. The subsequent operations such as detection operation of the voltage detection circuit 5 by the use of the analog switches S10 to S12. The stored electric energy dissipation operation of the flying capacitors with simultaneous turning-on of the output side analog switches S10 and S12 are the same as the operation described above.

The analog switches S5, S6, and S7 are turned on. The voltage of the battery block VB5 is read into the flying capacitor C1, and the voltage of the battery block VB6 is read into the flying capacitor C2. The subsequent operations such as detection operation of the voltage detection circuit by the use of the analog switches S10 to S12 and the stored electric energy dissipation operation of the flying capacitors C1 and C2 with simultaneous turning-on of the output side analog switches S10 and S12 are the same as those operated in the above.

The analog switches S7, S8, and S9 are turned on. The voltage of the battery block VB7 is read into the flying capacitor C2, and the voltage of the battery block VB8 is read into the flying capacitor C1. The subsequent operations such as detection operation of the voltage detection circuit 5 by the use of the analog switches S10 to S12. The stored electric energy dissipation operation of the flying capacitors with simultaneous turning-on of the output side analog switches S10 and S12 are the same as the above operation.

The voltage detection circuit 5 sequentially amplifies the voltages of the battery blocks VB1 to VB8 that have been detected sequentially, and the amplification is followed by absolute value processing and A/D conversion.

According to the second embodiment, because previous stored voltage is discharged and dissipated (may be residual partially) before the voltage of the voltage of the next battery block is read into the flying capacitors C1 and C2, the previous reversed stored voltage does not remain in the flying capacitors C1 and C2 when the voltage of the next battery block is read into the flying capacitors C1 and C2 with turning-on of the input side analog switch. As a result, an over-current will not flow through the input side analog switches S1 to S9 and the current limitation resistors R1 to R9, and these circuit elements can be made small and the reading time can be shortened. Furthermore, because high resistance current limitation resistors R1 to R9 can be used, a short-circuit current that flows when other analog switch is turned on is reduced during possible OFF failure of the input side analog switch. As a result the circuit safety is improved.

Figure 5:
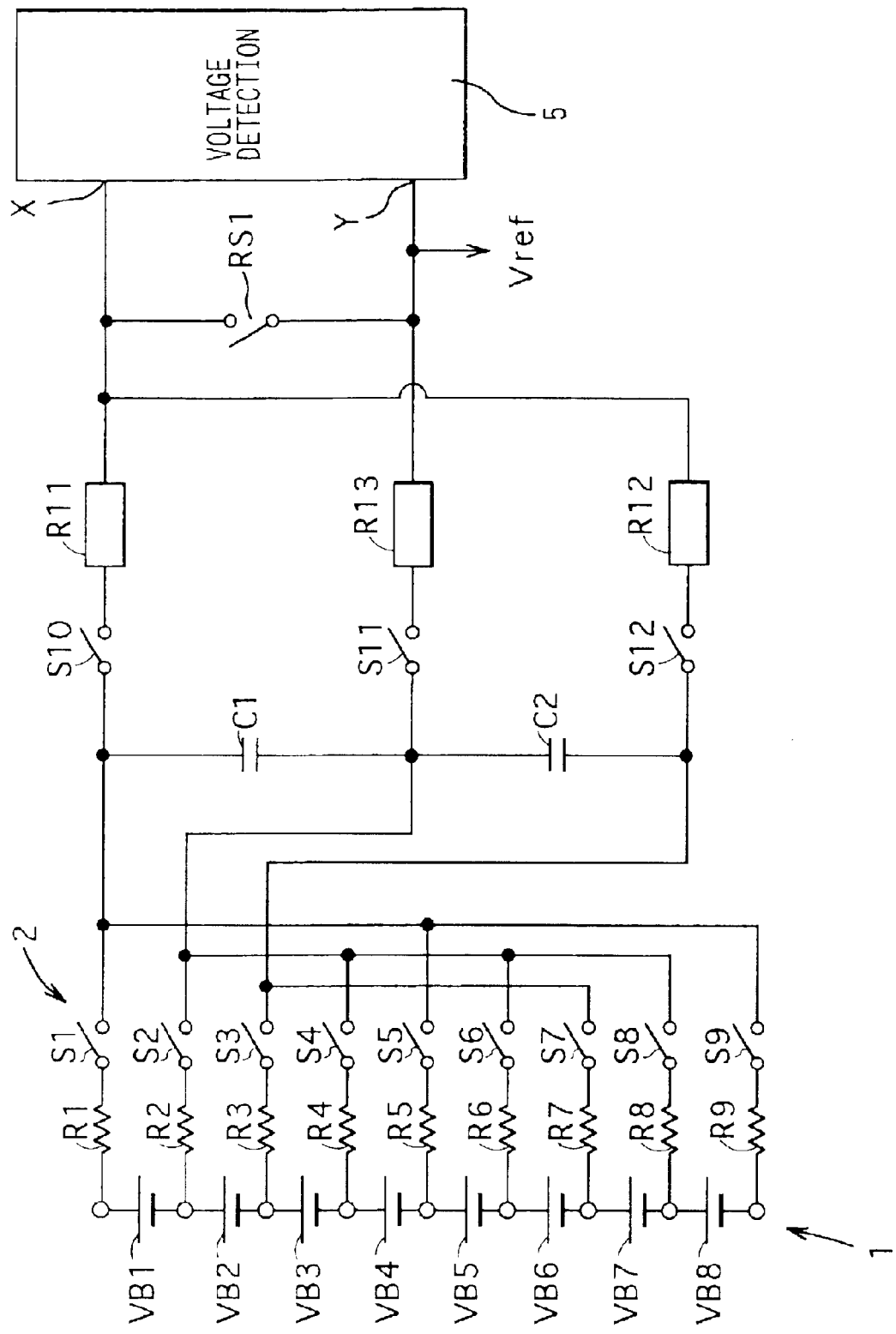
FIG. 5 is a circuit diagram showing a flying capacitor type battery pack voltage detection apparatus in accordance with a first modified embodiment of the second embodiment.

The second embodiment shown in FIG. 4 may be modified as shown in FIG. 5. In this first modification, a short-circuit switch RS1 is connected between both input terminals X and Y of the voltage detection circuit 5.

In operation, the analog switches S1, S2, and S3 are turned on. The voltage of the battery block VB1 is read into the flying capacitor C1, and the voltage of the battery block VB2 is read into the flying capacitor C2.

Next, the analog switches S1, S2, and S3 are turned off and the analog switches S10 and S11 are turned off for a predetermined period so that the potential difference of the flying capacitor C1 is read into the voltage detection circuit 5. Next, the analog switch S10 is turned off, and then the analog switches S11 and S12 are turned on for a predetermined period so that the potential difference of the flying capacitor C2 is read into the voltage detection circuit 5.

Next, the analog switches S10 to S12 and the short-circuit switch RS1 are turned on for a predetermined period so that the stored electric energy of the flying capacitors C1 and C2 is converted into thermal energy by means of the input resistors R11 and R12, and the potential of the input terminal X of the voltage detection circuit 5 is set to the reference potential Vref. In the subsequent operation, the voltages of other remaining battery blocks is read out sequentially as in the case of the second embodiment.

Figure 6:
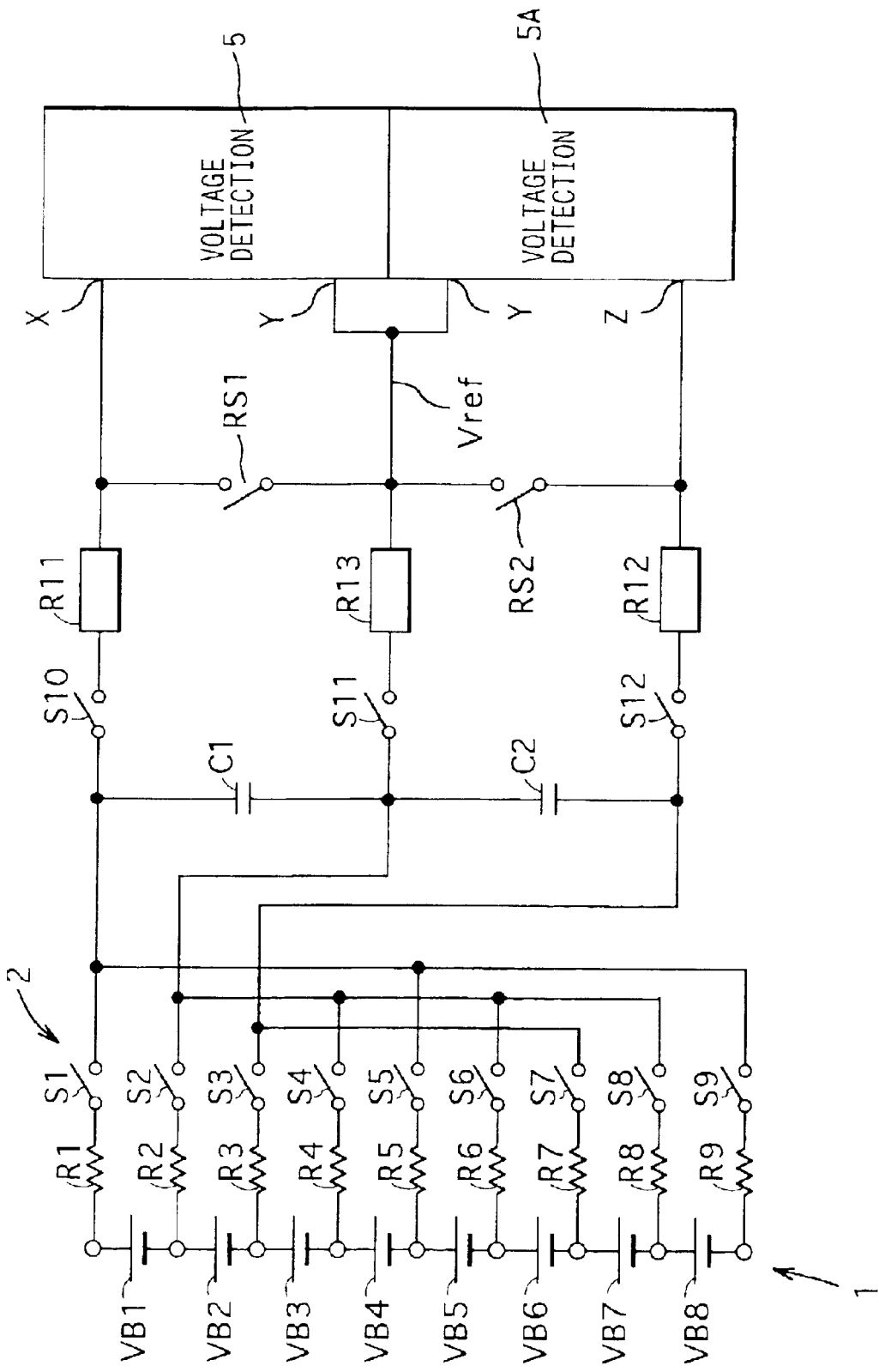
FIG. 6 is a circuit diagram showing a flying capacitor type battery pack voltage detection apparatus in accordance with a second modified embodiment of the second embodiment.

The first modification may be further modified as shown in FIG. 6. In this second modification, the voltage detection circuit 5 and the short-circuit switch RS2 are provided additionally. In this modification, the independent terminal of the second flying capacitor C2 is connected to the input terminal Z of the second voltage detection circuit through the second output side analog switch S12 and the second input resistor R12. Both ends of the short-circuit switch RS2 is connected to the input terminals Y and Z of the second voltage detection circuit 5A.

The voltages of the battery blocks VB1 and VB8 are detected by the use of this circuit in the following manner.

At first, the analog switches S1, S2, and S3 are turned on. The voltage of the battery block VB1 is read into the flying capacitor C1, and the voltage of the battery block VB2 is read into the flying capacitor C2.

Next, the analog switches S1, S2, and S3 are turned off and the analog switches S10 to S12 are turned on for a predetermined period. The potential difference of the flying capacitor C1 is read into the voltage detection circuit and the potential difference of the flying capacitor C2 is read into the voltage detection circuit 5A.

After the differential voltage detection circuits 5 and 5A detect the signal, the short-circuit switches RS1 and RS2 are turned on so that the stored electric charge of the flying capacitors C1 and C2 is dissipated by means of the input resistors R11 to R13 and the potential of the input terminals X and Z of the differential voltage detection circuits 5 and 5A are set to the reference potential. According to this modification, the measurement time of the first modification can be reduced to a half.

Figure 7:
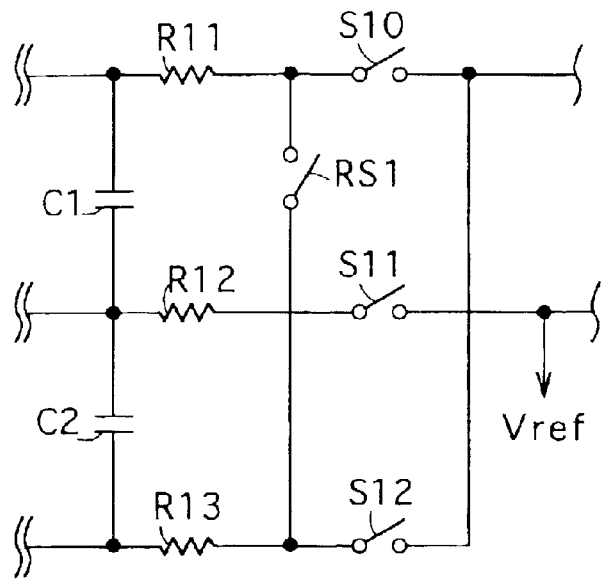
FIG. 7 is a circuit diagram showing a flying capacitor type battery pack voltage detection apparatus in accordance with a third modified embodiment of the second embodiment.

The first modification may be modified further as shown in FIG. 7. The input resistors R11 to R12 and the analog switches S10, S11, and S12 are disposed reversely, and the connection point between the input resistor R11 and the analog switch S10 is connected to the connection point between the input resistor R12 and the analog switch S12 with the short-circuit switch RS1. At first, the analog switches S10 and S11 are turned on to detect the voltage, and then the analog switch S10 is turned off and the short-circuit switch RS1 is turned on. As a result, the voltage of the flying capacitors C1 and C2 is changed to approximately 0 V if the electrostatic capacities of the flying capacitors C1 and C2 are nearly equal.

In this case, because the short-circuit switch RS1 is interposed between the low voltage side analog switches S10, S11, and S12 and the high voltage side analog switches S1 to S7, and because the short-circuit switch RS1 can be turned on in the duration from the turning-off of the analog switches S10 to S12 to the turning-on of three analog switches out of the analog switches S1 to S9, the processing time is shortened.

[Third Embodiment]

Figure 8:
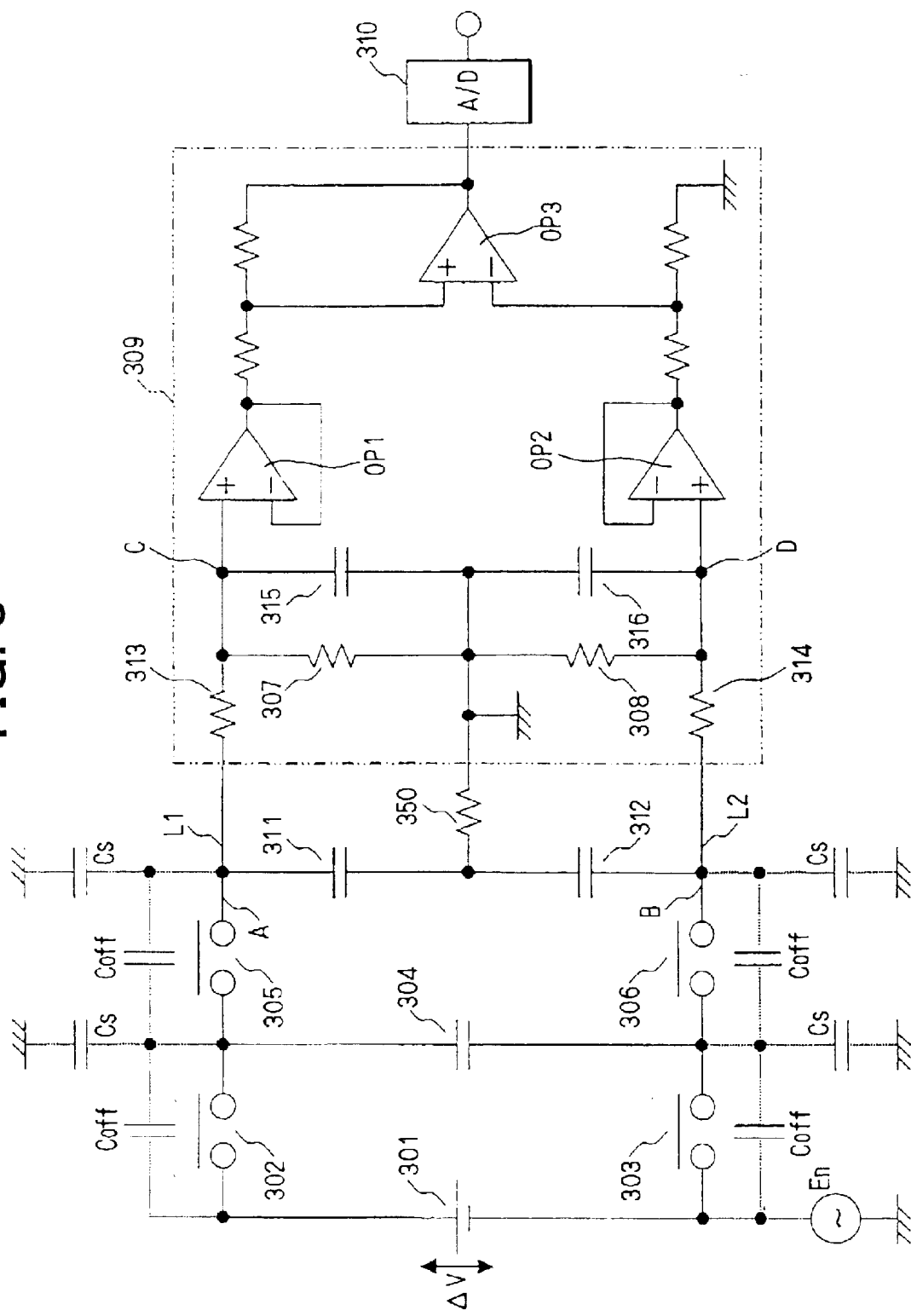
FIG. 8 is a circuit diagram showing a flying capacitor type battery pack voltage detection apparatus in accordance with a third embodiment.

A third embodiment of the battery pack voltage detection apparatus is shown in FIG. 8. Numeral 301 denotes a voltage source such as a battery cell, 302 and 303 denote input side analog switches, 304 denotes a flying capacitor, 305 and 306 denote output side analog switches, 307 and 308 denote resistors, 309 denotes a high input resistance differential amplifier circuit, 310 denotes an A/D-converter, 311 and 312 denote next stage capacitors, and 313 and 314 denote input resistors. The differential amplifier circuit 309 is provided with operational amplifiers OP1, OP2, and OP3. OP1 and OP2 constitute voltage follower circuits, and OP3 constitutes a voltage amplifier circuit.

Numerals 315 and 316 denote capacitors that are provided to connect + input terminals of a pair of operational amplifiers OP1 and OP2 to the ground, 350 denotes a current limitation resistor, A and B denote output terminals of the output side analog switches 305 and 306, C and D denote + input terminals of the operational amplifiers OP1 and OP2. Cs denotes a floating capacitance that has different electrostatic capacitance. Coff denotes a parasitic capacitance that connects both ends of the analog switches 302, 303, 305, and 306, and the magnitude is different depending on the structure of the switch.

The input side analog switches 302, 303 are provided to connect both ends of the voltage source 301 to both ends of the flying capacitor 304 individually. The output side analog switches 305 and 306 are provided to connect both ends of the flying capacitor 304 to both ends of signal lines L1 and L2 individually. The signal lines L1 and L2 have input resistors 313 and 314 individually on the middle. The output terminals A and B of the output side analog switches 305 and 306 are connected to one ends of the capacitors 311 and 312 individually, and the other ends of the capacitors 311 and 312 are grounded through the current limitation resistor 350. The + input terminals C and D of the pair of operational amplifiers OP1 and OP2 are connected to one ends of the resistors 307 and 308 individually, and the other ends of the resistors 307 and 308 are grounded.

The input resistors 313 and 314 have equal resistance value. The resistors 307 and 308 have equal resistance value. The capacitors 315 and 316 have equal capacitance value. The capacitors 311 and 312 have equal electrostatic capacitance value that is larger than the capacitance value of the floating capacitance Cs and smaller than the capacitance value of the flying capacitor 304.

The operation of the flying capacitor type voltage detection circuit of this embodiment operates as follows. At first, the output side analog switches 305 and 306 are turned off, and then the input side analog switches 302 and 303 are turned on so that a voltage $\Delta V$ of the voltage source 301 is sample-held in the flying capacitor 304.

Next, the input side analog switches 302 and 303 are turned off, and then the output side analog switches 305 and 306 are turned on so that the stored voltage of the flying capacitor 304 is applied between + input terminals C and D of the pair of operational amplifiers OP1 and OP2. As a result, the charge of the flying capacitor 304 is distributed to the capacitors 311 and 312.

Furthermore, the A/D-converter 310 is operated during turning-on of the output side analog switches 305 and 306 to sample the output voltage of the differential amplifier circuit 309 for analog-digital conversion. After the analog-digital conversion, the output side analog switches 305 and 306 are turned off.

By repeating turning-on and turning-off of the input side analog switches 302 and 303 and the output side analog switches 305 and 306, the voltage $\Delta V$ of the voltage source 301 can be measured with insulation.

The electric charge that has been charged in the capacitors 311 and 312 is discharged almost exhaustively during OFF state of the output side analog switches 305 and 306 through the input resistor group 307, 308, 313, and 314 of the differential amplifier circuit 309.

The noise voltage reduction is attained in this embodiment as follows. The voltage source 301 is in floating state with respect to the ground potential, and a common noise voltage En is superimposed on one end of the voltage source 301. The common noise voltage En passes into the signal lines L1 and L2 through the parasitic capacitance Coff. The common noise voltage En is almost canceled apparently from the output of the differential amplifier circuit 309, if the circuit constant of each paired circuit element is exactly equal. However, the partial common noise voltage En that has not been canceled due to differing circuit constant of each circuit element enters the output voltage.

To avoid this problem, the capacitors 311 and 312 are provided between the differential amplifier circuit side terminals of the output side analog switches 305 and 306 and the reference potential. The connection of the capacitors 311 and 312 in parallel to the resistors 307 and 308 increases the cut-off frequency of the high pass filter comprising the resistors 307 and 308 and the parasitic capacitance Coff. As a result the low frequency component of the common noise voltage En that entes the input terminals C and D can be reduced.

Furthermore, because the resistors 307 and 308 form a high pass filter together with the parasitic capacitance Coff in this embodiment, the low frequency component of the common noise voltage En can be reduced. Additionally, because the capacitors 315 and 318 form a low pass filter together with the input resistors 313 and 314 in this embodiment, the high frequency component of the common noise voltage En can be reduced. The cut-off frequency of the high pass filter is set approximately equal to that of the low pass filter by selecting the circuit constants suitably. Thereby, the common noise voltage En into the + input terminals C and D of the pair of operational amplifiers OP1 and OP2 can be eliminated over the almost entire frequency range.

Since the parasitic capacitance Coff and the capacitors 311 and 312 form a series connected component with respect to the common noise voltage En in this embodiment, the common noise voltage En is applied on the series connected component comprising the parasitic capacitance Coff and the capacitors 311 and 312, if the resistor such as the current limitation resistor 350 is ignored. Therefore, the common noise voltage En that is divided by the inverse number of capacitance ratio of the parasitic capacitance Coff and capacitance of the capacitors 311 and 312 is applied on the capacitors 311 and 312. For example, if the capacitance of the capacitors 311 and 312 is 100 times that of the parasitic capacitance Coff, about 1% of the common noise voltage En is applied on both ends of the capacitors 311 and 312, and the common noise voltage En component applied on the signal lines L1 and L2 is reduced significantly. To enhance this effect, it is preferable that the capacitance of the capacitors 311 and 312 is larger than that of the parasitic capacitance Coff.

However, if the capacitance of the capacitors 311 and 312 is too large, the natural discharge of the capacitors 311 and 312 though the resistors 307, 308, 313, and 314 can be insufficient after sampling of the A/D-converter 310. In such a case, a switch for discharging the charge of the capacitors 311 and 312 may be provided additionally, or the resistance value of the resistors 307, 308, 313, and 314 may be reduced.

In the same manner, the common noise voltage is mixed into the signal lines L1 and L2 through the floating capacitance Cs of respective circuits, and the common noise voltage is mixed through the parasitic capacitance between the analog switches 302, 303, 305, and 306 and the main electrode. However, because the capacitance of the floating capacitance Cs and the capacitors 311 and 312 function as the series connected component or parallel connected component to the common noise voltage that is mixed through the floating capacitance Cs, the capacitors 311 and 312 reduce the common noise voltage that is mixed through the floating capacitance Cs also in this case. Furthermore, the high pass filter function and low pass filter function reduce the common noise voltage that is mixed through the floating capacitance Cs apparently.

AC voltage component of the voltage source 301 arising from the current fluctuation of the voltage source 301 due to impedance change of the load to which the voltage source supplies an electric power, and the external noise voltage that enters electromagnetically into the line for connecting the voltage source 301 to the load impedance are superimposed on the voltage of the voltage source 301. These noise voltage is also reduced in the same manner as the common noise voltage En. That is, the circuit structure shown in FIG. 8 is effective in reducing AC noise voltage due to the common noise voltage and the voltage source because of the filter function of the differential amplifier circuit 309 and the capacitance division effect of the capacitors 311 and 312. As a result, the S/N ratio of the signal voltage is improved significantly.

The signal voltage that is read out from the flying capacitor 304 is essentially a DC voltage, and will not be cut off due to the filter function. The high pass filter function of the differential amplifier circuit 309 is effective in suppressing the delay of signal change response due to the low pass filter function, and resultantly effective in shortening the delay time that starts from the turning-on of the output side analog switches 305 and 306 and that ends with the input of the signal voltage of normal magnitude to the A/D-converter 310. As a result, the time required for operation can be shortened.

Next, the operation of the A/D-converter (signal processing circuit) 10 that samples the output voltage of the differential amplifier circuit 309 will be described additionally.

The sampling timing of the A/D-converter 310 is set at the time at least after elapse of the time equivalent to the time constant $\tau$=CR, which is obtained on the assumption that the low frequency passing filter characteristic of the differential amplifier circuit 309 is CR low pass filter, from the turning-on of the output side analog switches 305 and 306. Thereby, the signal propagation delay effect of the differential amplifier circuit 309 can be avoided.

The turning-on of the output side analog switches 305 and 306 causes distribution of the stored voltage of the flying capacitor 304 to the capacitors 311 and 312 and causes reduction of the stored voltage concomitantly. The voltage amplification factor of the differential amplifier circuit 309 is determined so as to compensate the reduction. In detail, the total voltage amplification factor is set to 1 or a predetermined constant value. At that time, it is more preferable that the voltage amplification factor of the differential amplifier circuit 309 is set to, for example, 1 with regard to the voltage reduction due to response delay of the differential amplifier circuit 309 at the time of sampling of the A/D-converter 310. As a matter of course, this voltage compensation may be attained in the A/D-converter 310.

In this embodiment, the current limitation resistor 350 is connected between the main terminal of the opposite-output side analog switch of the capacitors 311 and 312 (the main terminal (end) of the output side analog switch side means the main terminal (end) on the opposite side, namely the main terminal (end) on the reference power source side) and the ground potential (reference potential source).

Thereby, rush current that arises when the charge stored in the floating capacitance Cs between both terminals of the flying capacitor 304 and the ground is distributed to the capacitors 311 and 312 in the noise reduction circuit concomitantly with turning-on of the output side analog switches 305 and 306 is suppressed. The suppression of the rush current brings about suppression of large inductive serge voltage due to the effect of large current fluctuation, which arises at that time, on the wiring inductance of wiring such as the signal lines L1 and L2.

Figure 9:
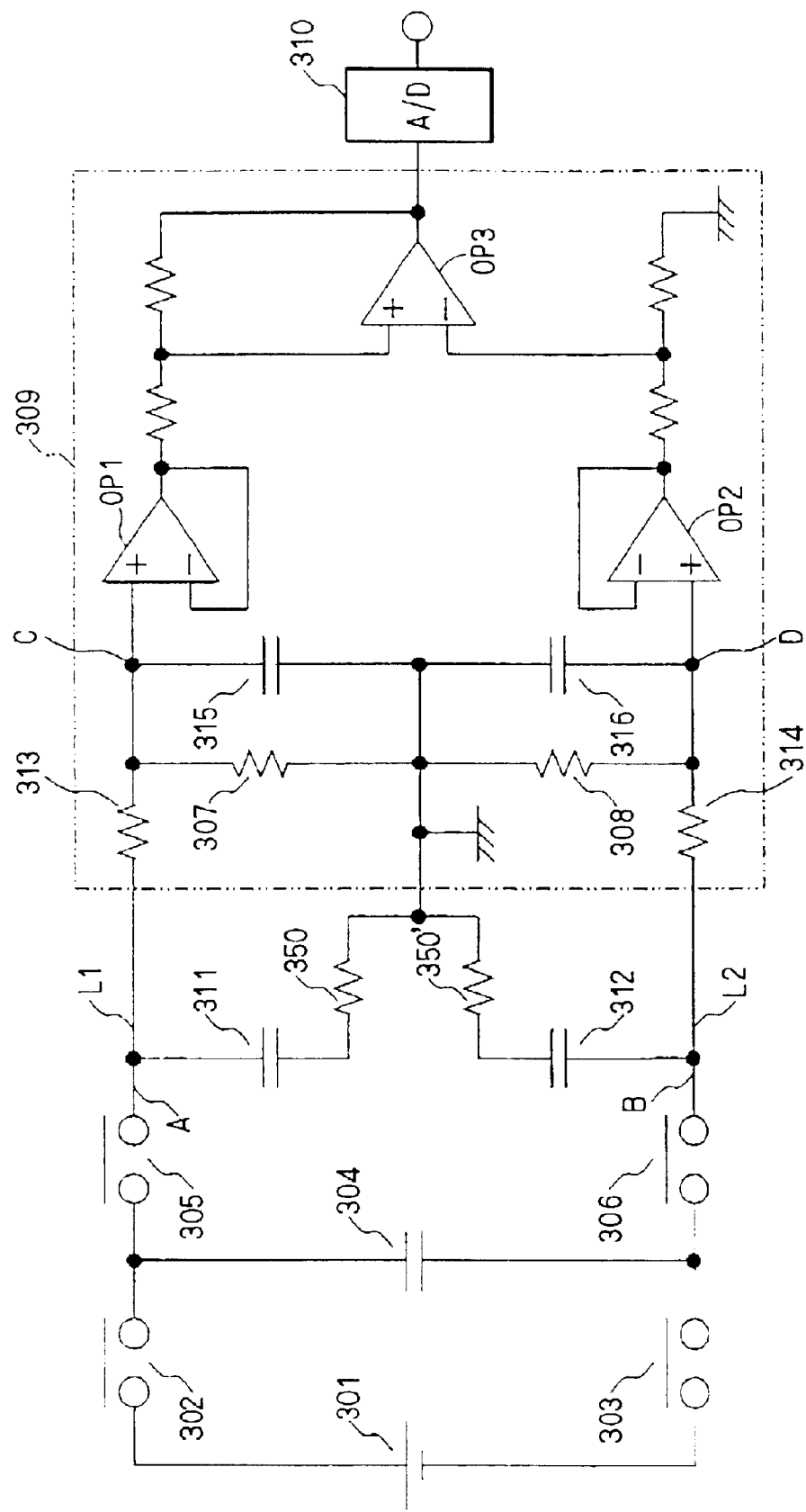
FIG. 9 is a circuit diagram showing a first modified embodiment of the third embodiment.

A first modification of the third embodiment is shown in FIG. 9. In this modification, a pair of current limitation resistors 350 and 350' having the equal resistance value is used instead of the current limitation resistor 350 shown in FIG. 8. The current limitation resistors 350 and 350' not only limit the current peak value due to distribution of the stored charge in the front end parasitic capacitance Cs distributed to the capacitors 311 and 312 but also limit the current peak value when the stored charge of the flying capacitor 304 is distributed to the capacitors 311 and 312.

Figure 10:
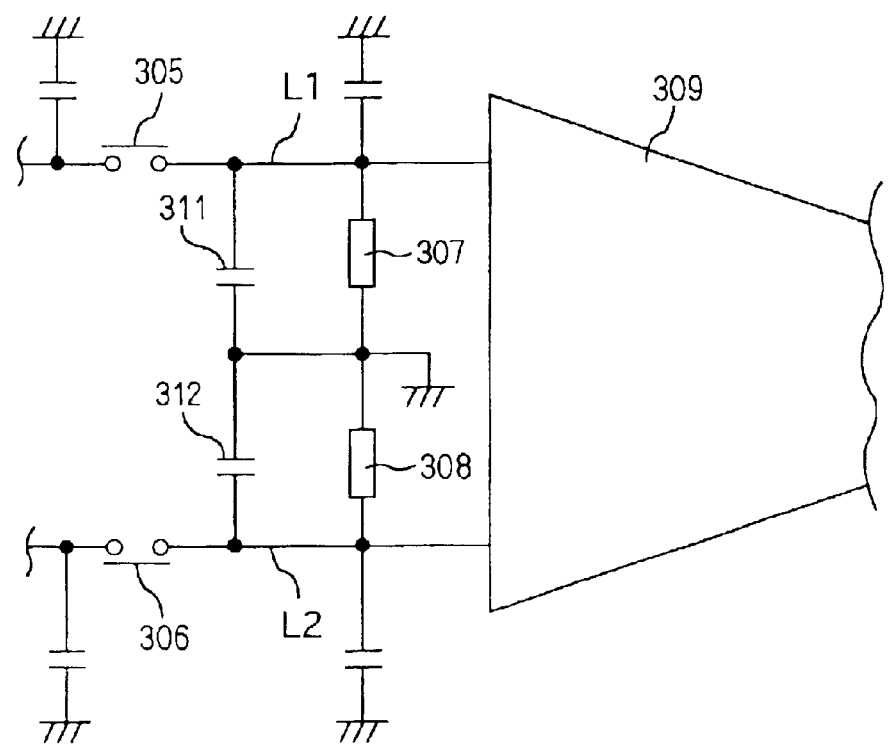
FIG. 10 is a circuit diagram showing a second modified embodiment of the third embodiment.

A second modification of the third embodiment is shown in FIG. 10. In this modification, the current limitation resistor 350 and input resistors 313 and 314 shown in FIG. 8 are omitted. Also in this case, shift of the signal lines L1 and L2 from the potential from ground due to distribution of charge stored in the parasitic capacitance on both ends of the flying capacitor 304 is suppressed.

Figure 11:
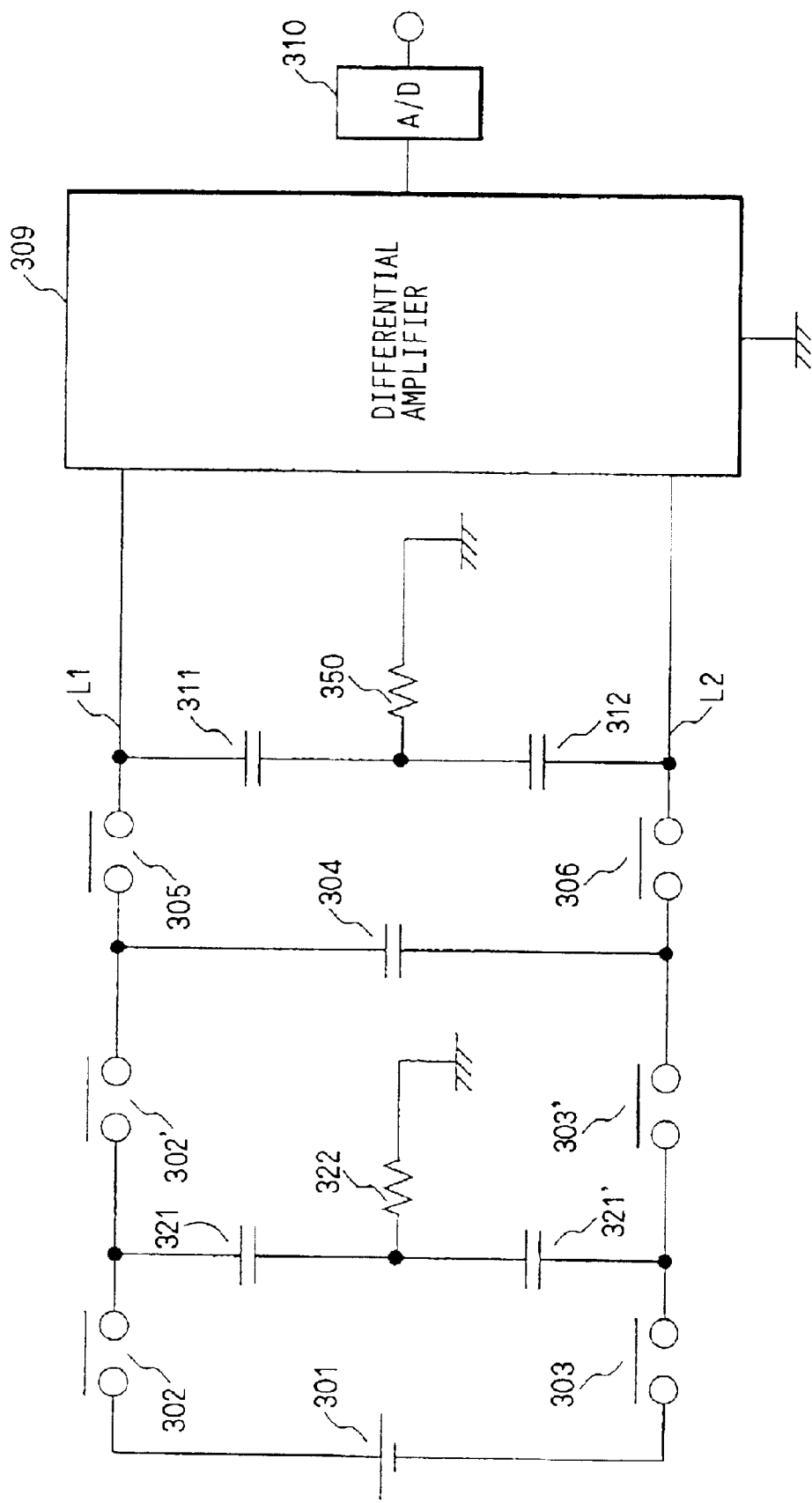
FIG. 11 is a circuit diagram showing a third modification of the third embodiment.

A third modification of the third embodiment is shown in FIG. 11. This modification is different from the third embodiment in that intermediate analog switches 302' and 303' are provided between both ends of the flying capacitor 304 and the flying capacitor side main terminals of the input side analog switches 302 and 303. The connection points between the input side analog switches 302 and 303 and the intermediate analog switches 302' and 303' are connected to one ends of a pair of capacitors 321 and 321' individually. The other ends of the capacitors 321 and 321' are grounded through the current limitation resistor 322. As a matter of course, the capacitors 321 and 321' have the same capacity. The function of the current limitation resistor 322 is the same as that of the current limitation resistor 350.

The intermediate analog switches 302' and 303' are turned on/off simultaneously with the input side analog switches 302 and 303. According to this modification, when the signal voltage is sampled by the A/D-converter in the state that all the analog switches 302, 302', 303, 303', 305, and 306 are turned off and the output side analog switches 305 and 306 are turned on. The common noise voltage En that is superimposed on the voltage source 301 is attenuated by the capacitors 321 and 321' in the same principle (FIG. 8,) and the common noise voltage that reaches the capacitors 311 and 312 is attenuated more, because the parasitic capacitance of the intermediate analog switches 302' and 303' is interposed in series.

Figure 12:
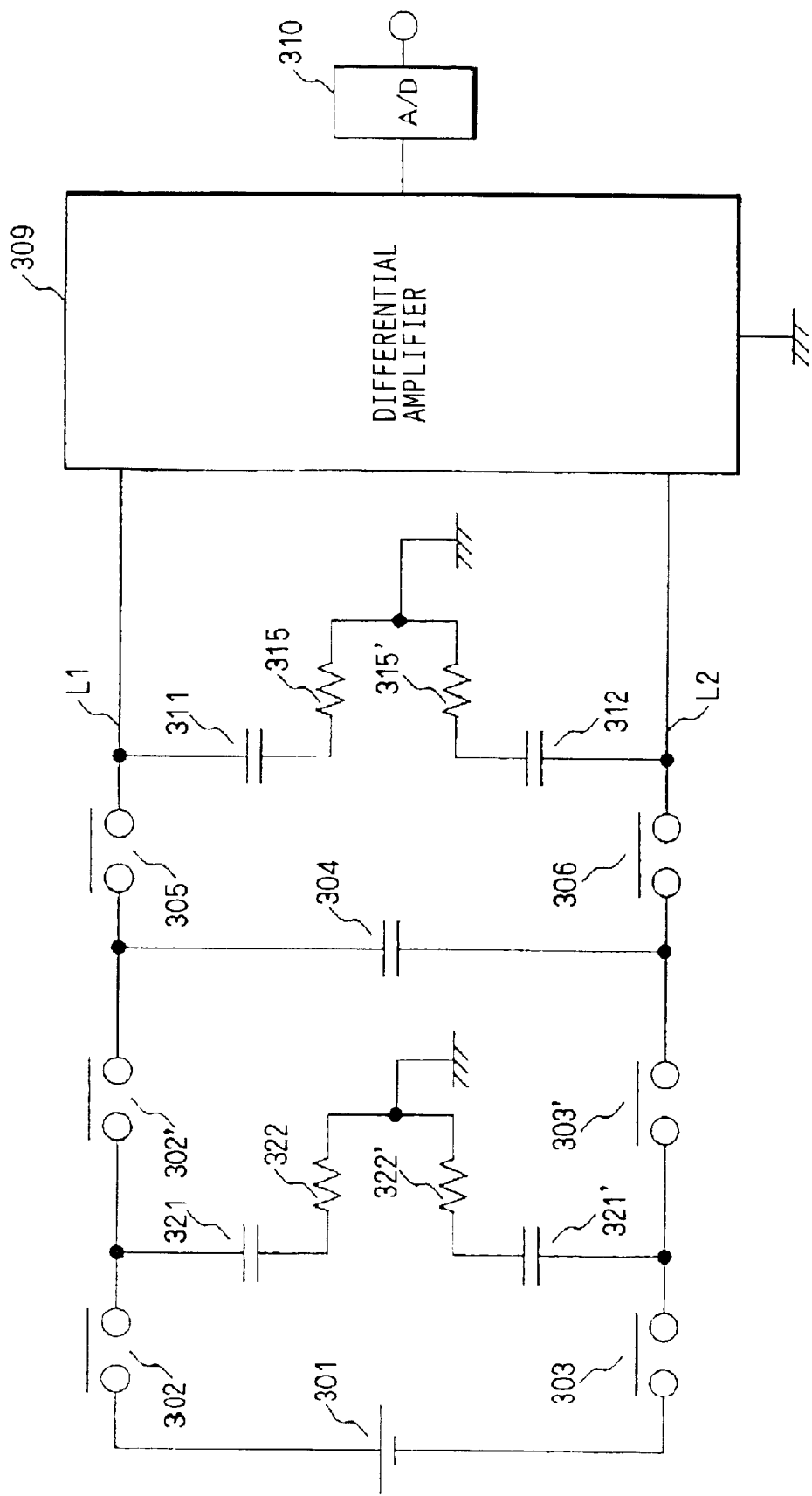
FIG. 12 is a circuit diagram showing a fourth modification of the third embodiment.

A fourth modification of the third embodiment is shown in FIG. 12. In this modification, in which a pair of current limitation resistors 322 and 322' that have an equal resistance value is used instead of current limitation resistor 322 shown in FIG. 11, and the essential function is the same as that of the modification shown in FIG. 9.

Figure 13:
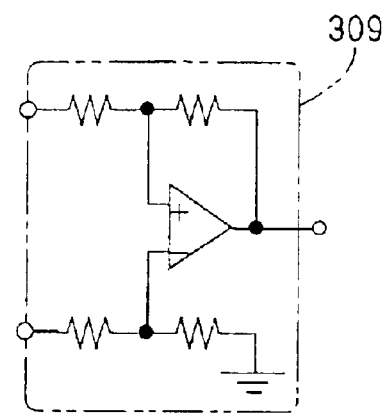
FIG. 13 is a circuit diagram showing a fifth modification of the third embodiment.

A fifth modification of the third embodiment is shown in FIG. 13. In this modification, the operational amplifier voltage circuit part of the differential amplifier circuit 309 is constituted of one amplifier type circuit, and the essential function is the same. As a matter of course, the operational amplifier voltage circuit part of the differential amplifier circuit 309 may be replaced with a known differential voltage amplifier circuit. Furthermore as a matter of course, a capacitor that is served as a low pass filter may be added to the operational amplifier part of the differential amplifier circuit 309 to change the frequency characteristic to the RC filter characteristic.

Figure 14:
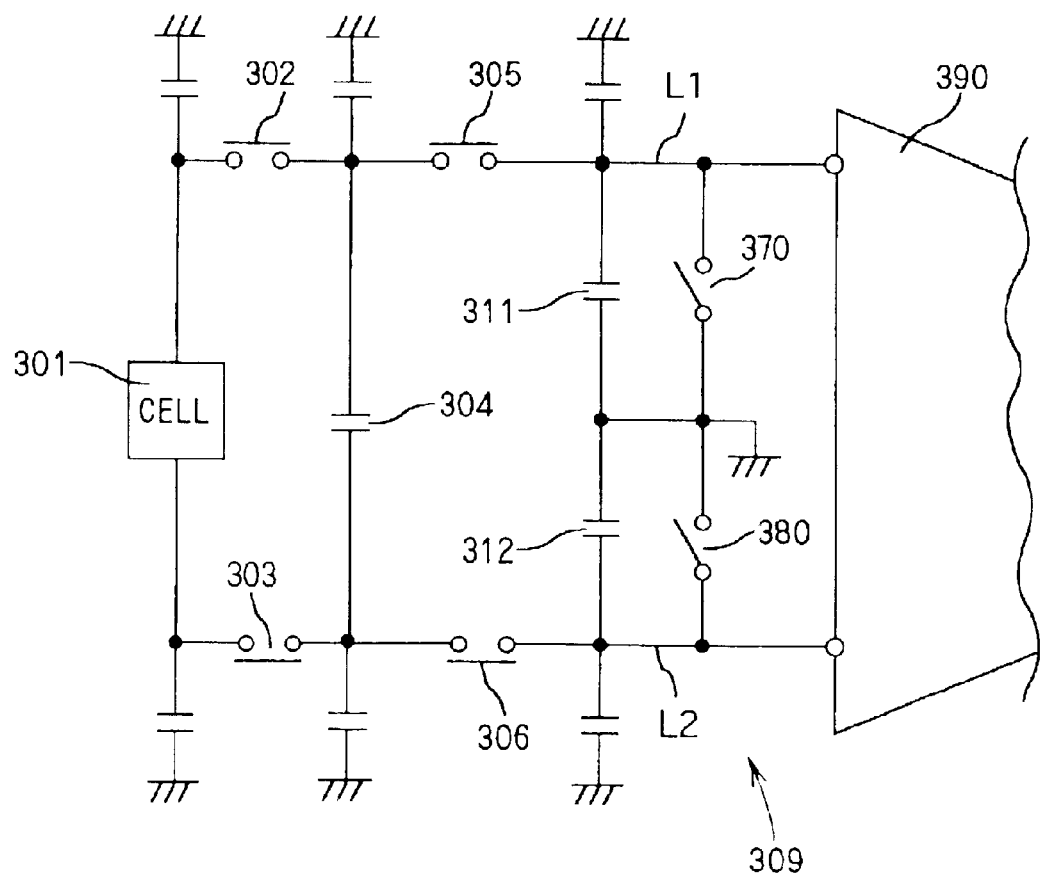
FIG. 14 is a circuit diagram showing a sixth modification of the third embodiment.

Sixth modification of the third embodiment is shown in FIG. 14. In this modification, potential setting resistors 307 and 308 shown in FIG. 10 are replaced with reset switches 370 and 380.

The reset switches 370 and 380 are OFF when the output side analog switches 305 and 306 are turned on. As a result, the stored electric charge of the flying capacitor 304 is distributed to the capacitors 311 and 312 when the output side analog switches 305 and 306 are turned on. This distribution is detected as a signal voltage by the operational amplifier voltage amplifier circuit of the differential amplifier circuit 309. At that time, the electric charge stored in the parasitic capacitance Cs on both ends of the flying capacitor 304 is distributed to the next capacitors 311 and 312 and the parasitic capacitance Cs that is connected in parallel to them, the shift of the signal lines L1 and L2 from the reference potential (ground potential) is suppressed. The attenuation with time of the signal voltage can be ignored because the potential setting resistors 307 and 308 are not provided. After sample holding of the signal voltage by the A/D-converter 310 and after the turning-off of the output side analog switches 305 and 306, the reset switches 21 and 22 are turned on, and the stored electric charge in the capacitors 311 and 312 is erased.

According to this modification, as a matter of course, the input resistors 313 and 314 and the current limitation resistors 315 and 315' shown in FIG. 8 may be added to the modification shown in FIG. 14. In this case, the potential setting resistors 307 and 308 shown in FIG. 8 may be replaced with reset switches 321 and 322.

Thus, according to this modification, because the stored electric charge in the next stage capacitor can be erased in a short time without residual electric charge in the next stage capacitor and without resultant mixing of residual electric charge with next electric charge that is sampled next, and the signal voltage attenuation due to discharge of the capacitors 311 and 312 is prevented.

Attenuation of the signal voltage due to charging of the capacitors 311 and 312 may be compensated by following circuit and processing in the sixth modification as in the case of the third embodiment shown in FIG. 8.

The sixth modification may be modified as described as follows. In detail, the output side analog switches 305 and 306 are turned on to read in the voltage of the flying capacitor type voltage detection circuit to the capacitors 311 and 312, then the output side analog switches 305 and 306 are turned off. Immediately after this, the output voltage of the differential amplifier circuit 309 that differentially amplifies the stored voltage of the capacitors 311 and 312 is sampled by the use of the A/D-converter 310. According to the above technique, because the common noise enters + input terminals of the pair of operational amplifiers OP1 and OP2 of the differential amplifier circuit 309 through the series connected component of pairs of parasitic capacitances Coff, the common noise En itself that enters to +input terminals C and D is reduced to a half.

The present invention should not be limited to the disclosed embodiments and modifications, but may be implemented in many other ways without departing from the spirit of the invention.

What is claimed is:

1. A battery pack voltage detection apparatus for detecting a voltage of a battery pack having first and second battery blocks connected in series, each battery block including a plurality of battery cells connected in series, the battery pack voltage detection apparatus comprising:
    a voltage detection circuit;
    a series capacitor circuit including a plurality of capacitors connected in series, the number of which is equal to the number of cells of the battery block;
    an input analog switch group that connects a terminal of each cell of the first battery block to a terminal of each capacitor individually so that each capacitor is charged by each cell of the first battery block individually, and that connects a terminal of each cell of the second battery block located on a low potential side with respect to the first battery block to a terminal of each capacitor in a potentially reverse order to the terminal of the first battery block; and
    an output analog switch group that connects the terminal of each capacitor to the input terminal of the voltage detection circuit separately.

2. The battery pack voltage detection apparatus as in claim 1, wherein the voltage detection circuit A/D-converts an input voltage supplied through the output analog switch group to obtain an A/D-converted value, and computes an A/D-converted value so as to convert it to a value that is equivalent to a positive value of a cell voltage if the A/D-converted value is equivalent to a negative value of the cell voltage.

3. The battery pack voltage detection apparatus as in claim 1, wherein:
    a reference potential is applied to a contact point between a pair of adjacent capacitors through an analog switch of the output analog switch group; and
    the voltage detection circuit measures the potential of the terminal different from the contact point between the pair of adjacent capacitors based on the reference potential.

4. The battery pack voltage detection apparatus as in claim 3, wherein the voltage detection circuit A/D-converts the potential of the terminal different from the contact point between the pair of capacitors and the reference potential, and subtracts the A/D-converted value of the reference potential from the A/D-converted value of the potential of the terminal to measure the voltage of the cell.

5. The battery pack voltage detection apparatus as in claim 1, wherein each cell is connected to the input analog switch group through a current limitation resistor.

6. The battery pack voltage detection apparatus as in claim 5, wherein the input analog switch group reads the cell voltage in each capacitor in parallel for a battery block one by one, and the output analog switch group reads out the potential of each capacitor sequentially to the voltage detection circuit.

7. The battery pack voltage detection apparatus as in claim 1, wherein the cells and the input analog switch group are connected in a mirror so that, each capacitor receives voltages of two battery blocks that are in mirror connection.

8. A battery pack voltage detection apparatus for detecting a voltage of a battery pack having a plurality of battery blocks connected in series, each battery block including a plurality of battery cells connected in series, the battery pack voltage detection apparatus comprising:
    a voltage detection circuit;
    a plurality of capacitors;
    an input analog switch group for supplying a plurality of cell voltages sequentially to the capacitors in opposite polarities; and
    an output analog switch for connecting a terminal of each capacitor to an input terminal of the voltage detection circuit,
    wherein the voltage detection circuit detects an absolute value of a capacitor voltage.

9. The battery pack voltage detection apparatus as in claim 8, wherein each cell is connected to the input analog switch group through a current limitation resistor.

10. The battery pack voltage detection apparatus as in claim 9, wherein the input analog switch group reads the cell voltage in each capacitor in parallel for a battery block one by one, and the output analog switch group reads out the potential of each capacitor sequentially to the voltage detection circuit.

11. The battery pack voltage detection apparatus as in claim 8, wherein the cells and the input analog switch group are connected in a mirror so that, each capacitor receives voltages of two battery blocks that are in mirror connection.

12. A battery pack voltage detection apparatus for detecting a voltage of a battery pack having a plurality of battery blocks connected in series, each block including a plurality of battery cells connected in series, the battery pack voltage detection apparatus comprising:

a plurality of capacitors for storing a cell voltage of the battery block;

an input analog switch group for supplying a voltage of each cell to the capacitor;

an output analog switch for supplying a stored voltage of the capacitor to the input terminal of a voltage detection circuit; and a currect detection circuit for detecting a current of the battery pack, wherein the current detection circuit samples the current when the input analog switch is substantially turned off.

13. The battery pack voltage detection apparatus as in claim 12, wherein each cell is connected to the input analog switch group through a current limitation resistor.

14. The battery pack voltage detection apparatus as in claim 13, wherein the input analog switch group reads the cell voltage in each capacitor in parallel for a battery block one by one, and the output analog switch group reads out the potential of each capacitor sequentially to the voltage detection circuit.

15. The battery pack voltage detection apparatus as in claim 12, wherein the cells and the input analog switch group are connected in a mirror so that, each capacitor receives voltages of two battery blocks that are in mirror connection.

16. A voltage detection apparatus comprising:

a voltage source;

a flying capacitor;

a pair of input side analog switches that connect both ends of the voltage source to both ends of the flying capacitor;

a differential amplifier circuit;

a pair of output side analog switches that connect a pair of input terminals of the differential amplifier circuit to both ends of the flying capacitor individually; and a common noise reduction circuit comprising a pair of capacitors having approximately the same electrostatic capacity that connect differential amplifier side terminals of both output side analog switches to a predetermined reference potential source individually.

17. The voltage detection apparatus as in claim 16, wherein the differential amplifier circuit has a low frequency passing filter characteristic having a time constant longer than a time constant that is determined based on a combined impedance of an impedance of an input resistance of the differential amplifier circuit and an impedance of the common noise reduction circuit and an OFF capacity of the input side analog switch.

18. The voltage detection apparatus as in claim 17, wherein:

the voltage detection circuit is provided with a signal processing circuit for sampling an output voltage of the differential amplifier circuit; and the signal processing circuit samples the output voltage of the differential amplifier circuit at the time at least after elapse of the time equivalent to the time constant from the turning-on of the output side analog switch.

19. The voltage detection apparatus as in claim 16, further comprising:

a second common noise reduction circuit having a pair of intermediate analog switches that connect both ends of the flying capacitor to a pair of input side analog switches individually, and having a pair of capacitors, which have approximately the same electrostatic capacity and connect the connection point between the input side analog switch and the intermediate analog switch to a predetermined reference potential source individually.

20. The voltage detection apparatus as in claim 16, wherein the reference potential source side ends of the pair of capacitors are connected to a reference potential source through a current limitation resistor.

21. The voltage detection apparatus as in claim 16, further comprising:

a compensation means for compensating attenuation of a signal voltage arising from charge transfer from the flying capacitor to the capacitors when the output side analog switch is turned on.

22. A voltage detection apparatus comprising:

a voltage source;

a flying capacitor;

a pair of input side analog switches that connect both ends of the voltage source to both ends of the flying capacitor individually;

a differential amplifier circuit having a low frequency passing type filter characteristic;

a pair of output side analog switches that connect a pair of input terminals of the differential amplifier to both ends of the flying capacitor individually;

a common noise reduction circuit having approximately a same electrostatic capacity that connect the differential amplifier circuit side terminal of both output side analog switches to a predetermined reference potential source individually; and a signal processing circuit for sampling the output voltage of the differential amplifier circuit at the time at least after elapse of the time equivalent to the time constant from the turning-on of the output side analog switch, wherein the time constant of the differential amplifier circuit is longer than the time constant that is determined based on the combined impedance of the impedance of the input resistance of the differential amplifier circuit and the impedance of the common noise reduction circuit and OFF capacity of the input side analog switch.

23. The voltage detection apparatus as in claim 22, further comprising:

a second common noise reduction circuit having a pair of intermediate analog switches that connect both ends of the flying capacitor to a pair of input side analog switches individually and having a pair of capacitors, which have approximately the same electrostatic capacity and connect the connection point between the input side analog switch and the intermediate analog switch to a predetermined reference potential source individually.

24. A voltage detection circuit comprising:

a voltage source;

a flying capacitor;

a pair of input side analog switches that connect both ends of the voltage source to both ends of the flying capacitor individually;

a differential amplifier circuit;

a pair of output side analog switches that connect a pair of input terminals of the differential amplifier to both ends of the flying capacitor individually;

a pair of capacitors having approximately the same electrostatic capacity and connecting the differential amplifier side terminals of both output side analog switches to a predetermined reference potential source individually; and a pair of reset switches for discharging both capacitors when connected in parallel to the pair of capacitors individually.

25. A battery pack voltage detection apparatus for detecting a voltage of a battery pack having a plurality of battery blocks connected in series, each block including a plurality of battery cells connected in series, the battery pack voltage detection apparatus comprising:

a plurality of capacitors for storing cell voltages of the battery block;

an input analog switch group for supplying the voltage of each cell to the capacitor;

an output analog switch for supplying a stored voltage of the capacitor to the input terminal of a voltage detection circuit; and a current detection circuit for detecting a current of the battery pack, wherein the input analog switch group supplies the voltage of each cell at different input timings, and wherein the current detection circuit sequentially samples the current synchronously with the input analog switch.

26. The battery pack voltage detection apparatus as in claim 25, wherein each cell is connected to the input analog switch group through a current limitation resistor.

27. The battery pack voltage detection apparatus as in claim 26, wherein the input analog switch group reads the cell voltage in each capacitor in parallel for a battery block one by one, and the output analog switch group reads out the potential of each capacitor sequentially to the voltage detection circuit.

28. The battery pack voltage detection apparatus as in claim 25, wherein the cells and the input analog switch group are connected in a mirror so that, each capacitor receives voltages of two battery blocks that are in mirror connection.

29. A battery pack voltage detection apparatus comprising:

a battery pack including m battery blocks connected in series to each other;

first and second flying capacitors connected in series;

a differential voltage detection circuit for detecting a potential difference between first and second input terminals;

first and second input resistors connected to the differential voltage detection circuit;

a first output side analog switch that connects an independent end of the first flying capacitor to the first input terminal of the differential voltage detection circuit through the first input resistor;

a second output side analog switch that connects an independent end of the second flying capacitor to the first input terminal of the differential voltage detection circuit through the second input resistor;

a third output side analog switch that connects connection ends of both capacitors to the second input terminal of the differential voltage detection circuit;

a first group input side analog switch that connects (4m+1)-th (m=0 or a positive integer) electrode terminals of electrode terminals of the battery pack to the independent end of the first flying capacitor individually;

a second group input side analog switch that connects (4m+3)-th (m=0 or a positive integer) electrode terminals of the electrode terminals to the independent end of the second flying capacitor individually;

a third group input side analog switch that connects 2m-th (m=a positive integer) electrode terminals of the electrode terminals to the connection ends of both flying capacitors individually; and a control unit for controlling the analog switches, wherein the control unit turns on the first and the second output side analog switches simultaneously to cause discharging of both flying capacitors.

30. The battery voltage detection apparatus as in claim 29, further comprising:

a third input resistor connected between the connection ends of both flying capacitors and the second input terminal of the voltage detection circuit in series with the third output side analog switch.

a third output side analog switch that connects connection ends of both capacitors to the second input terminal of the differential voltage detection circuit;

a first group input side analog switch that connects (4m+1)-th (m=0 or a positive integer) electrode terminals of electrode terminals of the battery pack to the independent end of the first flying capacitor individually;

a second group input side analog switch that connects (4m+3)-th (m=0 or a positive integer) electrode terminals of the electrode terminals of the battery pack to the independent end of the second flying capacitor individually;

a third group input side analog switch that connects 2m-th (m=a positive integer) electrode terminals of the electrode terminals to the connection end of both flying capacitors individually; and a control unit for controlling the analog switches, wherein the control unit turns on the first and the second output side analog switches simultaneously to cause discharging of both flying capacitors.

31. The battery pack voltage detection circuit comprising:

a battery pack including m battery blocks connected in series to each other;

first and second flying capacitors connected in series;

a differential voltage detection circuit for detecting the potential difference between first and second input terminals thereof;

first and second input resistors connected to the differential voltage detection circuit;

a first output side analog switch that connects an independent end of the first flying capacitor to the first input terminal of the differential voltage detection circuit through the first input resistor;

a second output side analog switch that connects an independent end of the second flying capacitor to the first input terminal of the differential voltage detection circuit through the second input resistor;

a third output side analog switch that connects connection ends of both capacitors to the second input terminal of the differential voltage detection circuit;

a first group input side analog switch that connects (4m+1)-th (m=0 or a positive integer) electrode terminals of electrode terminals of the battery pack to the independent end of the first flying capacitor individually;

a second group input side analog switch that connects (4m+3)-th (m=0 or a positive integer) electrode terminals of the electrode terminals to the independent end of the second flying capacitor individually;

a third group input side analog switch that connects 2m-th (m=a positive integer) electrode terminals of the electrode terminals to the connection ends of both flying capacitors individually;

a control unit for controlling the analog switches; and a short-circuit switch for short-circuiting between the first and the second input terminals of the differential voltage detection circuit to cause discharging of stored charge in the flying capacitors when the first or second analog switch and the third analog switch are turned on.

32. The battery voltage detection apparatus as in claim 31, further comprising:

a third input resistor connected between the connection ends of both flying capacitors and the second input terminal of the voltage detection circuit in series with the third output side analog switch.

33. The battery pack voltage detection apparatus comprising:

a first differential voltage detection circuit for detecting a potential difference between first and second input terminals;

a second differential voltage detection circuit for detecting a potential difference between second and third input terminals;

first, second and third input resistors connected to the first, second and third input terminals, respectively;

first and second flying capacitors connected in series;

a first output side analog switch that connects an independent end of the first flying capacitor to the first input terminal through the first input resistor;

a second output side analog switch that connects the connection ends of both capacitors to the second input terminal through the second input resistor;

a third output side analog switch that connects an independent end of the second flying capacitor to the third input terminal through the third input resistor;

a control unit for controlling the analog switch;

a first short-circuit switch for short-circuiting the first and second input terminals to cause discharging of stored charge in the first flying capacitor when the first analog switch and the second analog switch are turned on; and a second short-circuit switch for short-circuiting the second and third input terminals to cause discharging of stored charge in the second flying capacitor when the second analog switch and the third analog switch are turned on.

* * * * *